US008618807B2

(12) United States Patent  (10) Patent No.: US 8,618,807 B2
Albarede et al.  (45) Date of Patent: Dec. 31, 2013

(54) ARRANGEMENT FOR IDENTIFYING UNCONTROLLED EVENTS AT THE PROCESS MODULE LEVEL AND METHODS THEREOF

(75) Inventors: Luc Albarede, Fremont, CA (US); Vijayakumar C Venugopal, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 581 days.

(21) Appl. No.: 12/826,568

(22) Filed: Jun. 29, 2010

(65) Prior Publication Data
US 2010/0332014 A1 Dec. 30, 2010

Related U.S. Application Data

(63) Continuation-in-part of application No. 12/555,674, filed on Sep. 8, 2009.

(60) Provisional application No. 61/222,102, filed on Jun. 30, 2009, provisional application No. 61/222,024, filed on Jun. 30, 2009.

(51) Int. Cl.
*G01R 31/00* (2006.01)
(52) U.S. Cl.
USPC .......................................................... 324/500
(58) Field of Classification Search
USPC ........................ 324/409, 464, 536; 361/42–48
See application file for complete search history.

(56) References Cited

U.S. PATENT DOCUMENTS

| 4,310,880 A | 1/1982 | Gehman |
| 4,443,848 A | 4/1984 | Gehman |
| 4,659,413 A | 4/1987 | Davis et al. |

(Continued)

FOREIGN PATENT DOCUMENTS

| JP | 2003-197609 A | 7/2003 |
| KR | 10-2005-0030342 A | 3/2005 |
| KR | 10-2008-0006750 A | 1/2008 |
| WO | WO-2004/102642 A2 | 11/2004 |

OTHER PUBLICATIONS

Distributed Control, available Nov. 15, 2009 at http://www.pc-control.co.uk/distributed_control.htm.*

(Continued)

*Primary Examiner* — Melissa Koval
*Assistant Examiner* — Daniel Miller
(74) *Attorney, Agent, or Firm* — IPSG, P.C. Intellectual Property Law

(57) ABSTRACT

A method for detecting an in-situ fast transient event within a processing chamber during substrate processing is provided. The method includes a set of sensors comparing a data set to a set of criteria (in-situ fast transient events) to determine if the first data set includes a potential in-situ fast transient event. If the first data set includes the potential in-situ fast transient event, the method also includes saving an electrical signature that occurs in a time period during which the potential in-situ fast transient event occurs. The method further includes comparing the electrical signature against a set of stored arc signatures. If a match is determined, the method yet also includes classifying the electrical signature as a first in-situ fast transient event and determining a severity level for the first in-situ fast transient event based on a predefined set of threshold ranges.

10 Claims, 8 Drawing Sheets

(56) References Cited

U.S. PATENT DOCUMENTS

| | | |
|---|---|---|
| 4,661,196 A | 4/1987 | Hockersmith et al. |
| 4,785,399 A | 11/1988 | Evans et al. |
| 5,206,184 A | 4/1993 | Allen et al. |
| 5,272,872 A | 12/1993 | Grutter et al. |
| 5,450,205 A | 9/1995 | Sawin et al. |
| 5,479,340 A | 12/1995 | Fox et al. |
| 5,640,518 A | 6/1997 | Muhich et al. |
| 5,971,591 A | 10/1999 | Vona et al. |
| 5,986,747 A | 11/1999 | Moran |
| 6,021,215 A | 2/2000 | Kornblit et al. |
| 6,077,386 A | 6/2000 | Smith, Jr. et al. |
| 6,192,287 B1 | 2/2001 | Solomon et al. |
| 6,246,481 B1 | 6/2001 | Hill |
| 6,253,113 B1 | 6/2001 | Lu |
| 6,318,384 B1 | 11/2001 | Khan |
| 6,332,961 B1 * | 12/2001 | Johnson et al. .......... 204/192.13 |
| 6,343,251 B1 | 1/2002 | Herron et al. |
| 6,377,210 B1 | 4/2002 | Moore |
| 6,420,194 B1 | 7/2002 | Reitman |
| 6,553,277 B1 | 4/2003 | Yagisawa et al. |
| 6,567,718 B1 | 5/2003 | Campbell et al. |
| 6,665,576 B2 | 12/2003 | Hayashi |
| 6,745,096 B2 | 6/2004 | Yamamoto et al. |
| 6,805,810 B2 | 10/2004 | Smith, Jr. et al. |
| 6,813,534 B2 | 11/2004 | Sui et al. |
| 6,821,794 B2 | 11/2004 | Laursen et al. |
| 6,824,627 B2 | 11/2004 | Dhindsa et al. |
| 6,879,867 B2 | 4/2005 | Tanaka et al. |
| 6,895,293 B2 | 5/2005 | Reiss et al. |
| 6,902,646 B2 | 6/2005 | Mahoney |
| 6,969,619 B1 | 11/2005 | Winniczek |
| 7,010,374 B2 | 3/2006 | Tanaka et al. |
| 7,016,811 B2 | 3/2006 | Peck et al. |
| 7,050,873 B1 | 5/2006 | Discenzo |
| 7,058,467 B2 | 6/2006 | Tanaka et al. |
| 7,062,411 B2 | 6/2006 | Hopkins et al. |
| 7,082,345 B2 | 7/2006 | Shanmugasundram et al. |
| 7,103,443 B2 | 9/2006 | Strang |
| 7,107,115 B2 | 9/2006 | Tanaka et al. |
| 7,113,838 B2 | 9/2006 | Funk et al. |
| 2,398,082 A1 | 10/2006 | Funk et al. |
| 7,146,237 B2 | 12/2006 | Lev-Ami et al. |
| 7,158,848 B2 | 1/2007 | Tanaka et al. |
| 7,167,766 B2 | 1/2007 | Lam et al. |
| 7,217,336 B2 | 5/2007 | Strang |
| 7,257,457 B2 | 8/2007 | Imai et al. |
| 7,356,580 B1 | 4/2008 | Huang et al. |
| 7,373,216 B1 | 5/2008 | Winkler et al. |
| 7,376,479 B2 | 5/2008 | Tanaka et al. |
| 7,413,672 B1 | 8/2008 | Keil et al. |
| 7,477,960 B2 | 1/2009 | Willis et al. |
| 7,493,185 B2 | 2/2009 | Cheng et al. |
| 7,499,897 B2 | 3/2009 | Pinto et al. |
| 7,531,368 B2 | 5/2009 | Winkler et al. |
| 7,565,220 B2 | 7/2009 | Huang et al. |
| 7,620,511 B2 | 11/2009 | Shannon et al. |
| 7,647,237 B2 | 1/2010 | Malave et al. |
| 7,668,615 B2 | 2/2010 | Goff et al. |
| 7,672,747 B2 | 3/2010 | Huang et al. |
| 7,676,295 B2 | 3/2010 | Weetman |
| 7,713,758 B2 | 5/2010 | Yamashita et al. |
| 7,729,795 B2 | 6/2010 | Winkler et al. |
| 7,793,162 B2 | 9/2010 | Mock et al. |
| 7,805,639 B2 | 9/2010 | Mock et al. |
| 7,829,468 B2 | 11/2010 | Keil et al. |
| 7,835,814 B2 | 11/2010 | Mock et al. |
| 7,842,519 B2 | 11/2010 | Winkler et al. |
| 7,848,898 B2 | 12/2010 | Shannon et al. |
| 7,864,502 B2 | 1/2011 | Boyd et al. |
| 7,886,046 B1 | 2/2011 | Zeitoun et al. |
| 7,939,450 B2 | 5/2011 | Yamashita et al. |
| 7,967,995 B2 | 6/2011 | Funk et al. |
| 8,000,827 B2 | 8/2011 | Weetman et al. |
| 8,005,562 B2 | 8/2011 | Baek et al. |
| 8,014,991 B2 | 9/2011 | Mitrovic et al. |
| 8,032,348 B2 | 10/2011 | Mitrovic et al. |
| 8,036,869 B2 | 10/2011 | Strang et al. |
| 8,050,900 B2 | 11/2011 | Mitrovic et al. |
| 8,073,667 B2 | 12/2011 | Strang et al. |
| 8,140,719 B2 | 3/2012 | Lauterbach et al. |
| 2002/0177917 A1 | 11/2002 | Polla et al. |
| 2003/0087459 A1 | 5/2003 | Laursen et al. |
| 2003/0223055 A1 | 12/2003 | Agarwal et al. |
| 2003/0226821 A1 | 12/2003 | Huang et al. |
| 2004/0004708 A1 | 1/2004 | Willis |
| 2004/0031052 A1 | 2/2004 | Wannamaker et al. |
| 2004/0055868 A1 | 3/2004 | O'Leary et al. |
| 2004/0117054 A1 | 6/2004 | Gotkis et al. |
| 2004/0175880 A1 | 9/2004 | Tanaka et al. |
| 2004/0254762 A1 | 12/2004 | Hopkins et al. |
| 2005/0055175 A1 | 3/2005 | Jahns et al. |
| 2005/0071034 A1 | 3/2005 | Mitrovic |
| 2005/0071035 A1 | 3/2005 | Strang |
| 2005/0071036 A1 | 3/2005 | Mitrovic |
| 2005/0071037 A1 | 3/2005 | Strang |
| 2005/0071038 A1 | 3/2005 | Strang |
| 2005/0071039 A1 | 3/2005 | Mitrovic |
| 2005/0084988 A1 | 4/2005 | Huang et al. |
| 2005/0130125 A1 | 6/2005 | Zagyansky |
| 2005/0159911 A1 | 7/2005 | Funk et al. |
| 2005/0171627 A1 | 8/2005 | Funk et al. |
| 2005/0234574 A1 | 10/2005 | Lam et al. |
| 2006/0049831 A1 | 3/2006 | Anwar et al. |
| 2006/0144335 A1 | 7/2006 | Lee et al. |
| 2006/0171848 A1 | 8/2006 | Roche et al. |
| 2006/0180570 A1 | 8/2006 | Mahoney |
| 2006/0184264 A1 | 8/2006 | Willis et al. |
| 2006/0287753 A1 | 12/2006 | Plumhoff |
| 2007/0050076 A1 | 3/2007 | Yamazaki et al. |
| 2007/0110043 A1 | 5/2007 | Girard |
| 2007/0226540 A1 | 9/2007 | Konieczny |
| 2008/0061793 A1 * | 3/2008 | Anwar et al. ................. 324/464 |
| 2008/0082579 A1 | 4/2008 | Huang et al. |
| 2008/0082653 A1 | 4/2008 | Huang et al. |
| 2008/0208487 A1 | 8/2008 | Goebel et al. |
| 2008/0243988 A1 | 10/2008 | Huang et al. |
| 2009/0216920 A1 | 8/2009 | Lauterbach et al. |
| 2009/0242513 A1 | 10/2009 | Funk et al. |
| 2010/0125360 A1 | 5/2010 | Huang et al. |
| 2010/0198556 A1 | 8/2010 | Kost |
| 2010/0332013 A1 | 12/2010 | Choi et al. |
| 2010/0332014 A1 | 12/2010 | Albarede et al. |
| 2012/0101622 A1 | 4/2012 | Yun et al. |

OTHER PUBLICATIONS

"Non Final Office Action", U.S. Appl. No. 12/826,577, Mailing Date: Jun. 22, 2012.

"International Search Report", Issued in PCT Application No. PCT/US2010/040478; Mailing Date: Dec. 28, 2010.

"Written Opinion", Issued in PCT Application No. PCT/US2010/040478; Mailing Date: Dec. 28, 2010.

"Non Final Office Action", U.S. Appl. No. 12/555,674, Mailing Date: Dec. 23, 2011.

"International Search Report", Issued in PCT Application No. PCT/US2010/040477; Mailing Date: Feb. 8, 2011.

"Written Opinion", Issued in PCT Application No. PCT/US2010/040477; Mailing Date: Feb. 8, 2011.

"International Preliminary Report on Patentability", PCT Application No. PCT/US2010/042933, Mailing Date: Jan. 12, 2012.

"International Preliminary Report on Patentability", PCT Application No. PCT/US2010/040456, Mailing Date: Jan. 12, 2012.

"International Preliminary Report on Patentability", PCT Application No. PCT/US2010/040465, Mailing Date: Jan. 12, 2012.

"International Preliminary Report on Patentability", PCT Application No. PCT/US2010/040468, Mailing Date: Jan. 12, 2012.

"International Preliminary Report on Patentability", PCT Application No. PCT/US2010/040477, Mailing Date: Jan. 12, 2012.

"International Preliminary Report on Patentability", PCT Application No. PCT/US2010/040478, Mailing Date: Jan. 12, 2012.

"International Search Report", Issued in PCT Application No. PCT/US2010/040456; Mailing Date: Jan. 21, 2011.

(56) References Cited

OTHER PUBLICATIONS

"Written Opinion", Issued in PCT Application No. PCT/US2010/040456; Mailing Date: Jan. 21, 2011.
"International Search Report", Issued in PCT Application No. PCT/US2010/040465; Mailing Date: Jan. 17, 2011.
"Written Opinion", Issued in PCT Application No. PCT/US2010/040465; Mailing Date: Jan. 17, 2011.
"International Search Report", Issued in PCT Application No. PCT/US2010/040468; Mailing Date: Jan. 17, 2011.
"Written Opinion", Issued in PCT Application No. PCT/US2010/040468; Mailing Date: Jan. 17, 2011.
"International Search Report", Issued in PCT Application No. PCT/US2010/042933; Mailing Date: Feb. 18, 2011.
"Written Opinion", Issued in PCT Application No. PCT/US2010/042933; Mailing Date: Feb. 18, 2011.
"Non Final Office Action", U.S. Appl. No. 12/826,564; Mailing Date: Aug. 30, 2012.
"Non Final Office Action", U.S. Appl. No. 12/555,674, Mailing Date: Sep. 4, 2012.
"Finai Office Action", U.S. Appl. No. 12/826,577, Mailing Date: Oct. 22, 2012.
"Final Office Action", U.S. Appl. No. 12/826,564; Mailing Date: Feb. 27, 2013.

* cited by examiner

ARRANGEMENT FOR IDENTIFYING UNCONTROLLED EVENTS AT THE PROCESS MODULE LEVEL AND METHODS THEREOF

PRIORITY CLAIM

The present invention claims priority under 35 U.S.C. 119(e) to a commonly owned provisionally filed patent application entitled "Methods and Systems for Advance Equipment Control/Advance Process Control for Plasma Processing Tools," U.S. Application No. 61/222,102, filed on Jun. 30, 2009, by inventors Venugopal et al., all of which is incorporated herein by reference.

This application is a continuation-in-part and claims priority under 35 U.S.C. §120 to a commonly assigned application entitled "Arrangement for Identifying Uncontrolled Events at the Process Module Level and Methods Thereof," by Huang et al., application Ser. No. 12/555,674, filed on Sep. 8, 2009, which claim is related to and claims priority under 35 U.S.C. §119(e) under provisional patent application entitled "Arrangement for Identifying Uncontrolled Events at the Process Module Level and Methods Thereof," by Huang et al., application Ser. No. 61/222,024, filed on Jun. 30, 2009, both of which are incorporated by reference herein.

BACKGROUND OF THE INVENTION

Advances in plasma processing have provided for growth in the semiconductor industry. To be competitive, a manufacturing company needs to be able to process the substrates into quality semiconductor devices. Tight control of the process parameters is generally needed to achieve satisfactory results during substrate processing. When the processing parameters (e.g., RF power, pressure, bias voltage, ion flux, plasma density, and the likes) fall outside of a pre-defined window, undesirable processing results (e.g., poor etch profile, low selectivity, damage to the substrate, damage to the processing chamber, and the likes) may result. Accordingly, the ability to identify conditions when the processing parameters are outside the pre-defined windows is important in the manufacture of semiconductor devices.

During substrate processing, certain uncontrolled events may happen that may damage the substrate and/or cause damage to the processing chamber components. To identify the uncontrolled events, data may be collected during substrate processing. Monitoring devices, such as sensors, may be employed to collect data about the various process parameters (such as bias voltage, reflected power, pressure, and the likes) during substrate processing. As discussed herein, sensor refers to a device that may be employed to detect conditions and/or signals of a plasma processing component. For ease of discussion, the term "component" will be used to refer to an atomic or a multi-part assembly in a processing chamber.

The type and amount of data that are being collected by the sensors have increased in recent years. By analyzing the data collected by the sensors in relation to the process module data and the process context data (chamber event data), parameters that are outside of the pre-defined window may be identified. Accordingly, corrective actions (such as recipe adjustment) may be provided to stop the uncontrolled event(s), thereby preventing further damage from occurring to the substrate and/or the processing chamber components.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Figure 1:
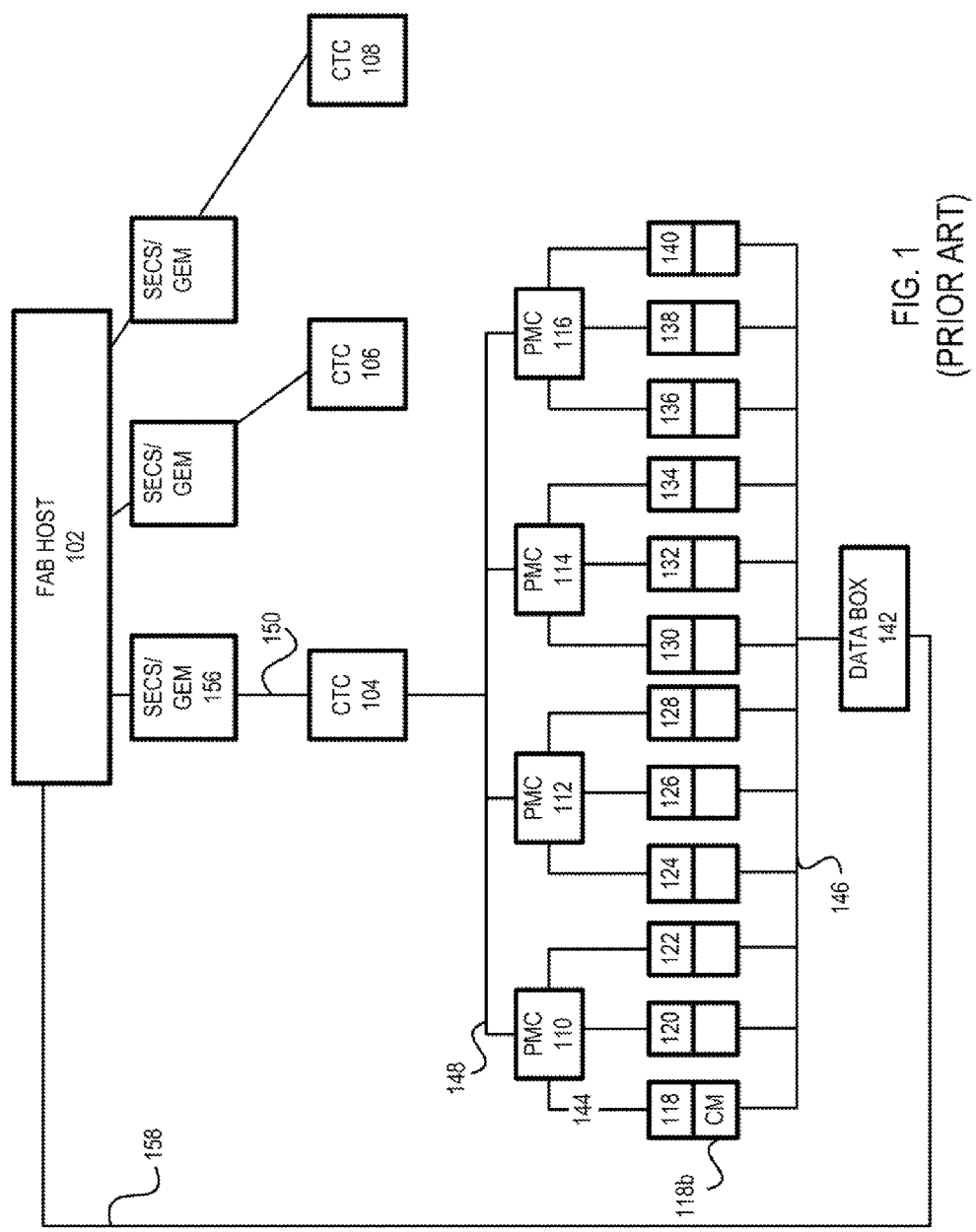
FIG. 1 shows a prior art overall logic view of an interconnecting tool environment with a host-level analysis server.

As aforementioned, to gain a competitive edge, manufacturers have to be able to effectively and efficiently troubleshoot problems that may arise during substrate processing. Troubleshooting generally involves analyzing the plethora of data collected during processing. To facilitate discussion, FIG. 1 shows a prior art overall logic view of an interconnecting tool environment with a host-level analysis server.

Consider the situation wherein, for example, a manufacturing company may have one or more cluster tools (such as etch tools, cleaning tools, strip tools, and the likes). Each cluster tool may have a plurality of processing modules, wherein each processing module is configured for one or more specific processes. Each cluster tool may be controlled by a cluster tool controller (CTC), such as CTC 104, CTC 106, and CTC 108. Each cluster tool controller may interact with one or more process module controller (PMC), such as PMCs 110, 112, 114, and 116. For ease of discussion, examples will be provided in relation to PMC 110.

In order to identify conditions that may require intervention, sensors may be employed to collect data (sensed data) about processing parameters during substrate processing. In an example, during substrate processing a plurality of sensors (such as sensors 118, 120, 122, 124, 126, 128, 130, 132, 134, 136, 138, and 140) may interact with the process module controllers to collect data about one or more processing parameters. The type of sensors that may be available may depend upon the type of data that may be collected. For example, sensor 118 may be configured to collect voltage data. In another example, sensor 120 may be configured to collect pressure data. Generally, the sensors that may be employed to collect data from a process module may be of different brands, makes, and/or models. As a result, a sensor may have little or no interaction with another sensor.

Usually, a sensor is configured to collect measurement data about one or more specific parameters. Since most sensors are not configured to perform processing, each sensor may be coupled to a computing module (such as a computer, user interface, and the likes). The computing module is usually configured to process the analog data and to convert the raw analog data into a digital format.

In an example, sensor 118 collects voltage data from PMC 110 via sensor cable 144. The analog voltage data received by sensor 118 is processed by a computing module 118*b*. The data collected by the sensors are sent to a host-level analysis server (such as data box 142). Before sending the data onward to data box 142 over the network connection, the data is first converted from an analog format into a digital format by the computing module. In an example, computing module 118*b* converts the analog data collected by sensor 118 into a digital format before sending the data over a network path 146 to data box 142.

Data box 142 may be a centralized analysis server that is configured to collect, process, and analyze data from a plurality of sources, including the sensors and the process modules. Usually, one data box may be available to process the data collected during substrate processing by all of the cluster tools of a single manufacturing company.

The actual amount of data that may be transmitted to data box 142 may be significantly less than the amount collected by the sensors. Usually, a sensor may collect a massive amount of data. In an example, a sensor may collect data at rates of up to 1 megabyte per second. However, only a fraction of the data collected by the sensors is sent to data box 142.

One reason for not transmitting the entire data streams collected by the sensors to data box 142 is due to the network bandwidth limitation when using cost-effective, commercially available communication protocols. The network pipeline to data box 142 may not be able to handle large volume of data from a plurality of sources (such as sensors 118, 120, 122, 124, 126, 128, 130, 132, 134, 136, 138, and 140) being sent to a single receiver (such as data box 142). In other words, the network path between the sensor arrangements (sensor and computing module) and data box 142 may experience major traffic congestion as data box 142 tries to receive the massive amount of data coming from all of the sensor arrangements. As can be appreciated from the foregoing, if data box 142 is unable to handle the incoming traffic, the data packets being sent may be dropped and may have to be resent, thereby putting an additional burden onto the already heavily congested network pipeline.

In addition, data box 142 may not be able to handle a high volume of incoming data from multiple sources while at the same time performing other important functions, such as processing and analyzing data. As aforementioned, data box 142 is not only configured to receive the incoming data packets but data box 142 is also configured to process and analyze all of the incoming data streams, for example. Since data box 142 is the analysis server for the different data streams being collected, data box 142 needs sufficient processing capability to perform analysis on the plethora of data streams.

Since data box 142 has limited processing resource, only a fraction of the data collected from each sensor is sent to data box 142. In an example, of the thousands of data items that may be collected by a single sensor, only 10-15 data items at 1-5 hertz may be forwarded to data box 142. In one example, only a summary of the data collected by sensor 118 may be sent to data box 142.

In addition to receiving data from the plurality of sensors, data box 142 may also be receiving data from the process module controllers. In an example, process module data and process context data (chamber-event data) may be collected by each process module controller and forwarded to data box 142. For ease of discussion, process module data and process context data may also be referred to as process module and chamber data. For example, process module data and process context data may be collected by PMC 110 and be sent to CTC 104 via a path 148. CTC 104 is not only managing the data from PMC 110 but may also be handling the data from the other processing module controllers within the cluster tool (such as PMC 112, PMC 114, and PMC 116).

The data collected by the cluster tool controller is then transmitted to a fab host 102 via a semiconductor equipment communication standard/generic equipment module (SECS/GEM) interface. In an example, CTC 104 transmits data collected from PMCs 110, 112, 114, and/or 116 to fab host 102 through SECS/GEM 156 via a path 150. Fab host 102 may not only be receiving data from CTC 104, but also may be receiving data from other cluster tool controllers, such as CTCs 106 and 108, for example. The data collected by fab host 102 is then forwarded to data box 142 via a path 158. Due to the sheer volume of data being collected, not all data being sent to fab host 102 is forwarded to data box 142. In many instances, only a summary of the data may be transmitted to data box 142.

Data box 142 may process, analyze and/or correlate the data collected by the sensors and the process module controllers. If an anomaly is identified, data box 120 may then determine the source of the problem, such as a parameter that is not in conformance with a recipe step being performed in PMC 110, for example. Once the source of the problem has been identified, data box 142 may send an interdiction in the format of an Ethernet message to fab host 102. Upon receiving the message, fab host 102 may forward the message through SECS/GEM 156 to CTC 104. The cluster tool controller may then relay the message to the intended process module controller, which is PMC 110 in this example.

Unfortunately, the interdiction is usually not provided in real-time. Instead, the interdiction is usually received by the intended process module after the affected substrate has been processed or even after the entire substrate lot has exited the process module. Accordingly, not only have the substrate/substrate lot been damaged, but one or more processing chamber components may have also been negatively impacted, thereby increasing waste and increasing ownership cost.

One reason for the delay is due to the sheer volume of data being received from a plethora of sources. Even if data box 142 may be configured with a fast processor and have sufficient memory to handle the large volume of data streams, data box 142 may still need time to process, correlate and/or analyze all of the data being collected.

Another reason for the delay in receiving the interdiction by the process module is due to the incomplete data streams that are being received by data box 142. Since data box 142 is receiving data from a plethora of sources, the actual data that is being sent to data box 142 is significantly less than the data being collected. In an example, instead of sending the 1 gigahertz data stream that is being collected by sensor 118, only a fraction (about 1-5 hertz) of the data is actually being sent. As a result, even though data box 142 is receiving a high volume of data from all of its sources, the data that is being received is usually incomplete. Thus, determining an uncontrolled event may take time given that data box 142 may not have access to the complete data set from all sources.

In addition, the paths by which the data are being sent to data box 142 may vary. In an example, data are sent directly from a sensor arrangement (that is sensor and its computing module) after the analog data has been converted into digital data. In contrast, the data collected by the process module is transmitted over a longer network path (through at least cluster tool controller and fab host). Accordingly, data box 142 is unable to complete its analysis until all related data streams have been received.

Not only is the network path between a process module and data box 142 longer but the data streams sent through this path are usually faced with at least two bottlenecks. The first bottleneck is at the cluster tool controller. Since the data collected by the process modules within a cluster tool is being sent to a single cluster tool controller, the first bottleneck occurs since the data streams from the various process modules have to be processed through a single cluster tool controller. Given the sheer volume of data that can be transmitted from each process module, the network path to the cluster tool controller usually experiences heavy traffic congestion.

Once the data has been received by the cluster tool controller, the data is transmitted to fab host 102. The second bottleneck may occur at fab host 102. Given that fab host 102 may be receiving data from various cluster tool controllers, traffic into fab host 102 may also be experiencing congestion due to the high volume of data being received.

Since data box 142 needs the data from the different sources in order to determine an uncontrolled event, the traffic condition between a process module and data box 142 prevents timely delivery of the data streams to data box 142. As a result, precious time is lost before data box 142 has gathered all the necessary data to perform analysis. Furthermore, once an interdiction is prepared, the interdiction has to travel through the same lengthy path back to the affected process module before the interdiction can be applied to perform corrective action.

Another factor contributing to the delay is the challenge of correlating data from the various data sources. Since the data streams being received by data box 142 is usually a summary of the data collected from each sensor and/or process modules, correlating the data may be a challenging task since the data streams available may be of different time intervals. In an example, the selected data streams transmitted to data box 142 from sensor 118 may be at a one second interval while the data streams from PMC 110 may be at a two second interval.

As a result, correlating data streams may require time before an uncontrolled event may be definitively determined.

An additional challenge for correlating the data is due to the different paths by which the data are being sent to data box 142. As the data is being transmitted through different computers, servers, and the likes, the data may be exposed to computer drift, network latency, network loading and the likes. As a result, data box 142 may have difficulty correlating the data from the various sources. Given that a tight correlation is required to quickly identify uncontrolled events, more analysis may be required to be performed before an uncontrolled event may be accurately identified.

Another disadvantage of the solution provided in FIG. 1 is the cost of ownership. In addition to the cost of maintaining a cluster tool system, additional cost is associated with the sensor arrangements. Since each sensor may be of different brands/makes/models, each sensor arrangement usually includes a sensor and a computing module. Physical space is usually required to house each of the sensor arrangements. Accordingly, the cost of housing the sensor arrangement can become pricey, especially in areas in which real estate prices can be high.

Figure 2:
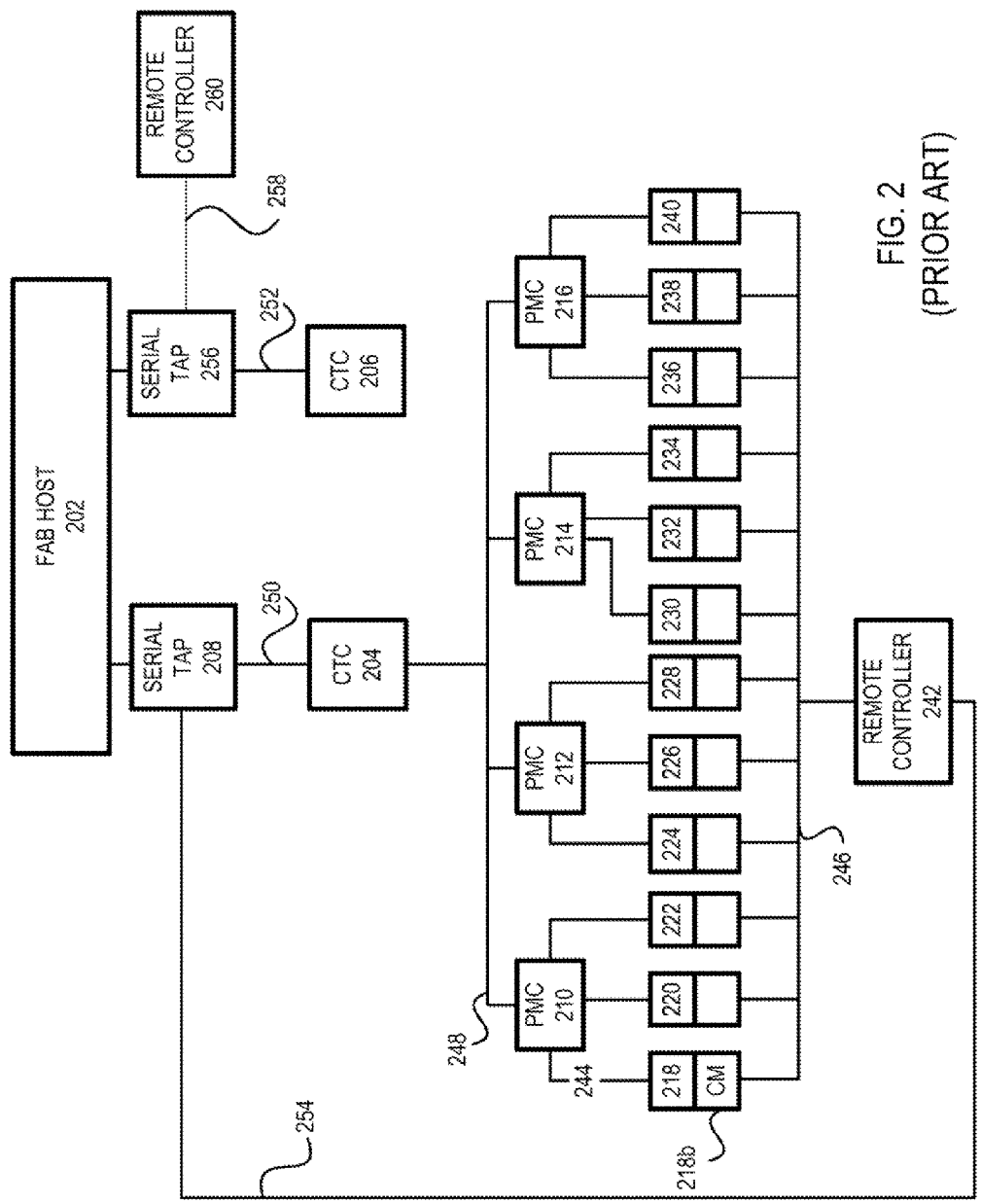
FIG. 2 shows a simple block diagram of an interconnecting tool environment with a cluster tool level solution for correlating data between the sensors and the process model controllers.

To reduce the actual time delay between the actual occurrence of the uncontrolled event within the process module and the receipt of the interdiction by the process module, a cluster-level analysis server is provided. FIG. 2 shows a simple block diagram of an interconnecting tool environment with a cluster-tool-level solution for correlating data between the sensors and the process model controllers.

Similar to FIG. 1, a cluster tool may include a plurality of process modules (such as PMCs 210, 212, 214, and 216). To collect data for analysis, each process module may be coupled to a plurality of sensors (such as sensors 218, 220, 222, 224, 226, 228, 230, 232, 234, 236, 238, and 240). Each sensor may interact with its corresponding process module controller via a sensor cable (such as sensor cable 244) to collect processing parameter data. The data collected by the sensor may be in analog format. A computing module (such as computing module 218b) may process and convert the data into a digital format before forwarding the data via a path 246 to a cluster-level analysis server (such as remote controller 242).

Similar to FIG. 1, each process module controller may also transmit data (such as process module data and process context data) to a cluster tool controller (such as CTC 204 and 206). In an example, data collected by PMC 210 may be transmitted to CTC 204 via a path 248. Besides receiving data from PMC 210, CTC 204 may also be receiving data from the other processing module controllers (such as PMC 212, 214, and 216). The data received by the cluster tool controller is then forwarded via a path 250 to a fab host 202.

Between fab host 202 and CTC 204, a serial tap may be connected to network path 250 to duplicate the data being forwarded to fab host 202. In an example, a serial tap 208 may intercept the data being forwarded by CTC 204 to fab host 202. The data is duplicated and a copy of the data stream is sent to remote controller 242 via a path 254. If the fab host is connected to more than one cluster tool controller, than for each cluster tool controller, a dedicated remote controller is associated with the cluster tool controller. In an example, the data being sent from CTC 206 to fab host 202 via a path 252 is intercepted by another serial tap (256). The data is duplicated and sent via a path 258 to a remote controller (260) that is different than the remote controller (242) associated with CTC 204.

Hence, instead of a single data box to handle all the data from the various cluster tools, multiple remote controllers may be available to handle the data from the various cluster tools. In other words, each cluster tool is associated with its own remote controller. Since each remote controller is handling data from a fewer number of data sources (such as the process module controllers and the sensors associated with a single cluster tool), each remote controller is able to handle a higher volume of data from each source. In an example, instead of 30-100 data items being sent, about 40 kB-100 kB data items at 10 hertz may now be received by each remote controller.

Data received from the sensors and the process module controllers are analyzed by the remote controller. If a problem is identified, the remote controller may send an interdiction to the cluster tool controller. In an example, remote controller 242 identifies a problem within PMC 210. An interdiction is sent via paths 254 and 250 through serial tap 208 to CTC 204. Upon receiving the interdiction, CTC 204 forwards the interdiction to the intended process module controller, which is PMC 210 in this example.

Since the remote controller is only responsible for handling data from one cluster tool instead of a plurality of clusters tools (as being done by data box 142), more data may be analyzed and better correlation may exist between the different data sets. As a result, the remote controller may perform better and faster analysis, thereby providing more timely intervention to correct an uncontrolled event within a processing module. In an example, instead of receiving an interdiction to prevent an identified uncontrolled event from happening in the next substrate lot (such as the interdiction provided by data box 142), the interdiction sent by remote controller 242, for example, may enable the process engineers to salvage at least part of the substrate lot that is scheduled to be processed.

Although the remote controller solution is a better solution than the data box solution, the remote controller solution still depends upon summary data to perform its analysis. As a result, problems that may be occurring during substrate processing may remain unidentified. Further, the path between the process module and the remote controller is still not a direct path. As a result, computer drift, network latency, and/or network loading may cause time discrepancy that may make it difficult for the remote controller to correlate the data from the sensors with the data from the process modules.

Thus, even though the remote controller solution has increased the timeliness of the interdiction, the remote controller solution is still inadequate. At best, the interdiction may be able to prevent a problem experienced by the affected substrate from occurring during the processing of the next substrate. In a fiercely competitive market where cost needs to be minimized, waste due to damaged substrate and/or downtime due to damaged processing chamber components may translate into market loss. Accordingly, a real-time solution for identifying uncontrolled event is desired.

In accordance with embodiments of the present invention, a process-level troubleshooting architecture (PLTA) is provided in which troubleshooting is performed at the process module level. Embodiment of the invention includes a process-level troubleshooting architecture that provides for real-time analysis with real-time interdiction. Embodiment of the invention further includes arrangements for load balancing and fault tolerance between sensors.

In an embodiment of the invention, the process-level troubleshooting architecture is a network system in which an analysis server is communicating with a single processing module and its corresponding sensors. In an embodiment, the information being exchanged in the network is bidirectional. In an example, the analysis server may be continually receiving process data from the processing module and sensors. Conversely, the sensors may be receiving data from the processing module and the processing module may be receiving instructions from the analysis server.

Consider the situation wherein, for example, a substrate is being processed. During substrate process, a plurality of data may be collected. In an example, data about pressure is collected every 100 milliseconds. If the processing takes one hour, 36,000 data items have been collected for the pressure parameter. However, a plurality of other process data (e.g., voltage bias, temperature, etc.), besides pressure data, may also be collected. Thus, a considerable amount of data is being collected by the time the substrate process has completed.

In the prior art, the data are transmitted to an analysis server that may be configured to service data collected from a plurality of processing modules (such as remote controller 242 of FIG. 2) if not from a plurality of cluster tools (such as data box 142). Since the data streams are coming from a plurality of sources, time is required to analyze and/or correlate the data. Further, since the analysis server of the prior art may not be able to process and analyze all of the data collected, only a fraction of data collected from each source is transmitted to the analysis server. As a result, the complex task of coordinating, processing, correlating, and/or analyzing the data streams requires time that may not always be readily available.

In one aspect of the invention, the inventors herein realized that a more accurate and quicker analysis may be performed if more granular data is available for analysis. In order to analyze more data from a single source, the analysis server has to be analyzing data from fewer sources. In an embodiment, an arrangement is provided for processing and/or analyzing data at a process module level. In other words, a process-module-level analysis server is provided for performing analysis for each process module and its corresponding sensors.

In an embodiment, the process-module-level analysis server includes a shared memory backbone that may include one or more processors. Each processor may be configured to interact with one or more sensors. In an example, data collected by sensor 1 may be processed by processor 1 while data collected by sensor 2 is processed by processor 2.

Unlike the prior art, the processors may share its processing power with one another to perform load balancing and fault tolerance. In the prior art, a computing module is configured to handle the data collected by a sensor. Since each computing module is an individual unit and usually does not interact with one another, load balancing is usually not performed. Unlike the prior art, the set of processors within the process-module-level analysis server may perform load balancing. In an example, if processor 1 is experiencing data overload while processor 2 is receiving little or no data, processor 2 may be recruited to assist processor 1 in processing the data from sensor 1.

Furthermore, in the prior art, if a computing module is malfunctioning, other computing modules is unable to take over the processing performed by the malfunctioning computing module since the computing modules tend to be of different brands/makes/models. Unlike the prior art, workload may be redistributed between the processors as needed. For example, if processor 2 is unable to perform its function, the workload may be redistributed to other processor until processor 2 is fixed. As can be appreciated from the foregoing, the processors eliminate the need for individual computing modules, thereby also reducing the physical space required to house the computing modules.

In an embodiment of the invention, the processors may be divided into two types of processors: primary processor and secondary processor. Both primary and secondary processors are configured to handle data from sensors. In an example, if secondary processor 1 is associated with sensor 1 then secondary processor 1 usually only process data coming from sensor 1. Likewise, if secondary processor 2 is associated with sensors 2 and 3, then secondary processor 2 usually only process data coming from those two sensors (2 and 3).

In an embodiment, the shared memory backbone may include one or more primary processors. The set of primary processors may be configured not only to handle data from the sensors but may also be configured to handle data coming from the processing module. In addition, the set of primary processors is configured to correlate the data between the various sources (such as the sensors and processing module) and perform analysis. If an interdiction is needed, the set of primary processors is configured to send the interdiction to the process module controller.

The features and advantages of the present invention may be better understood with reference to the figures and discussions that follow.

Figure 3:
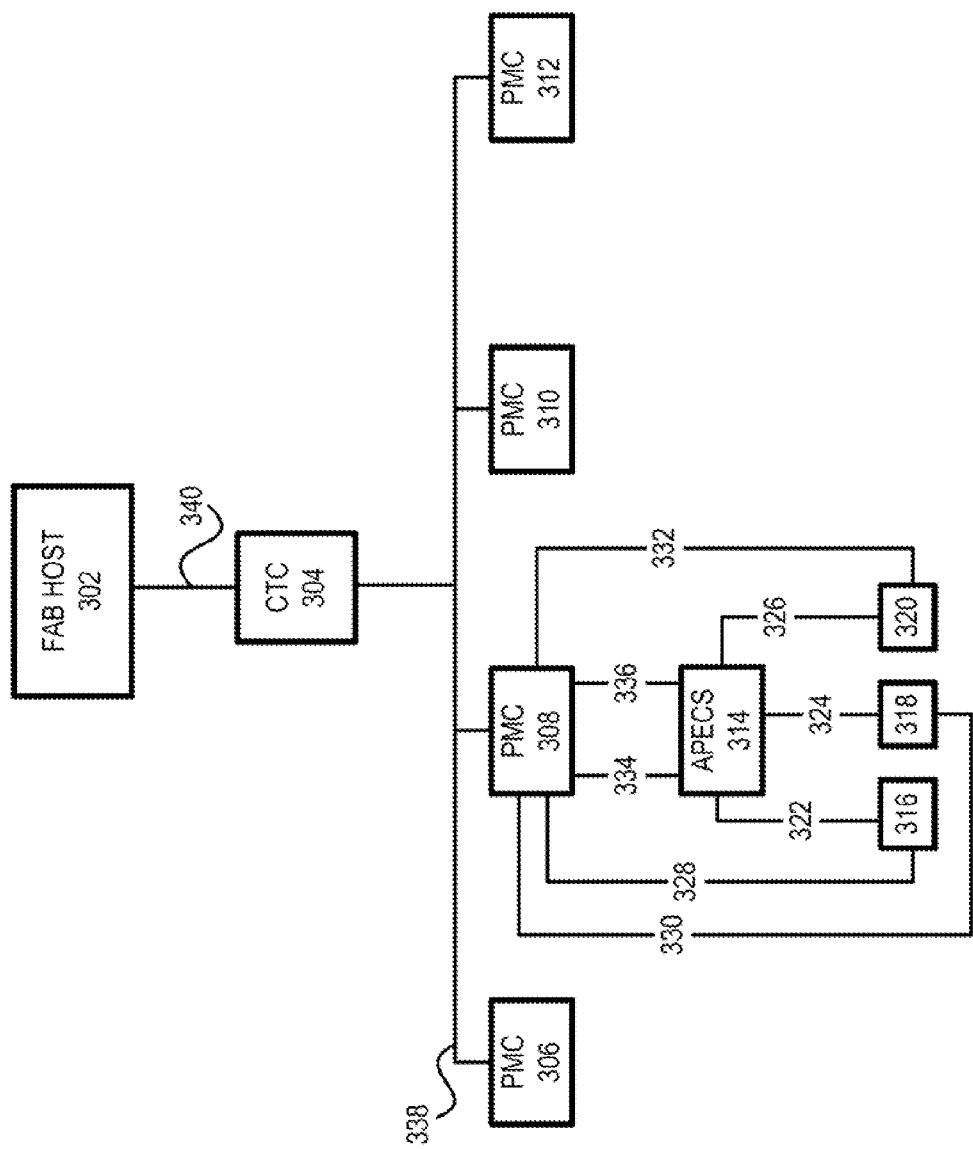
FIG. 3 shows, in an embodiment of the invention, a simple logic overview of a process-level troubleshooting architecture.

FIG. 3 shows, in an embodiment of the invention, a simple logic overview of a process-level troubleshooting architecture. Although a manufacturing company may have more than one cluster tool, a single cluster tool is used as an illustration of one embodiment of the invention. Although a cluster tool may have a varying number of processing modules, the example illustrated in FIG. 3 include a single cluster tool with four processing modules.

The data collected by each processing module is collected by its corresponding processing module controllers (PMC 306, PMC 308, PMC 310, and PMC 312) and transmitted to a fab host 302 via a cluster tool controller (CTC) 304. The data that may be transmitted by the PMCs may be the same type of data (process module data and process context data) that has been previously sent in the prior art. Unlike the prior art, the data being transmitted to fab host 302 is not relied upon by the processing modules to perform troubleshooting. Instead, the data may be archived and be made available for future analysis.

In an embodiment, a process-module-level analysis server (APECS 314) is provided to perform the analysis needed for troubleshooting. Consider the situation wherein a substrate is being etched in PMC 308. During substrate processing, sensors 316, 318, and 320 are collecting data from PMC 308. In an example, sensor 316 is configured to collect voltage bias data from PMC 308. Analog data collected from PMC 308 is sent via sensor cable 328 to sensor 316. Likewise, sensors 318 and 320 may be collected data via sensor cables 330 and 332, respectively. The data collected by the sensors may then be transmitted via one of the paths 322, 324, and 326 to APECS 314 for processing and/or analysis.

Unlike the prior art, data collected by the sensors do not have to be preprocessed (such as summarized, for example) before being transmitted to the analysis server (APECS 314). In an embodiment, instead of having a computing module to process the data, each sensor may include a simple data converter that may be employed to convert the analog data into digital data before forwarding the data to APECS 314. Alternatively, a data converter, such as a field-programmable gate array (FPGA) may be built into APECS 314, in an embodiment. In an example, each processor may include a data converter algorithm for converting the data into a digital format as part of its processing. As can be appreciated from the foregoing, by eliminating the need for a computing module, less physical space is required to house the cluster tool and its hardware. As a result, the cost of ownership may be reduced.

Since APECS 314 is dedicated to processing data only from one processing module and its corresponding sensors, APECS 314 is able to handle a higher volume of data coming from a single source. In other words, instead of having to pare down the volume of data transmitted from each sensor, APECS 314 is configured to handle most, if not all, of the data collected by each sensor. In an example, instead of just 10-15 data items being sent for analysis, now two thousands plus data items from each sensor may be available for analysis by APECS 314. As a result, the data stream that is available for APECS 314 to process and analyze is a more complete data set.

In an embodiment, APECS 314 is also configured to handle the data coming from the processing module. Unlike the prior art in which the data stream is sent through a lengthy data path through various servers (e.g., cluster tool controller, fab host, etc.) before being received by the analysis server (such as the data box or the remote controller), the data collected by the process module is sent directly to APECS 314 without having to go through other servers. In an example, process module data may be sent from PMC 308 to APECS 314 via a path 334. If an uncontrolled event is identified, an interdiction may be sent directly to PMC 308 via a path 336 without having to go through other servers first.

Figure 4:
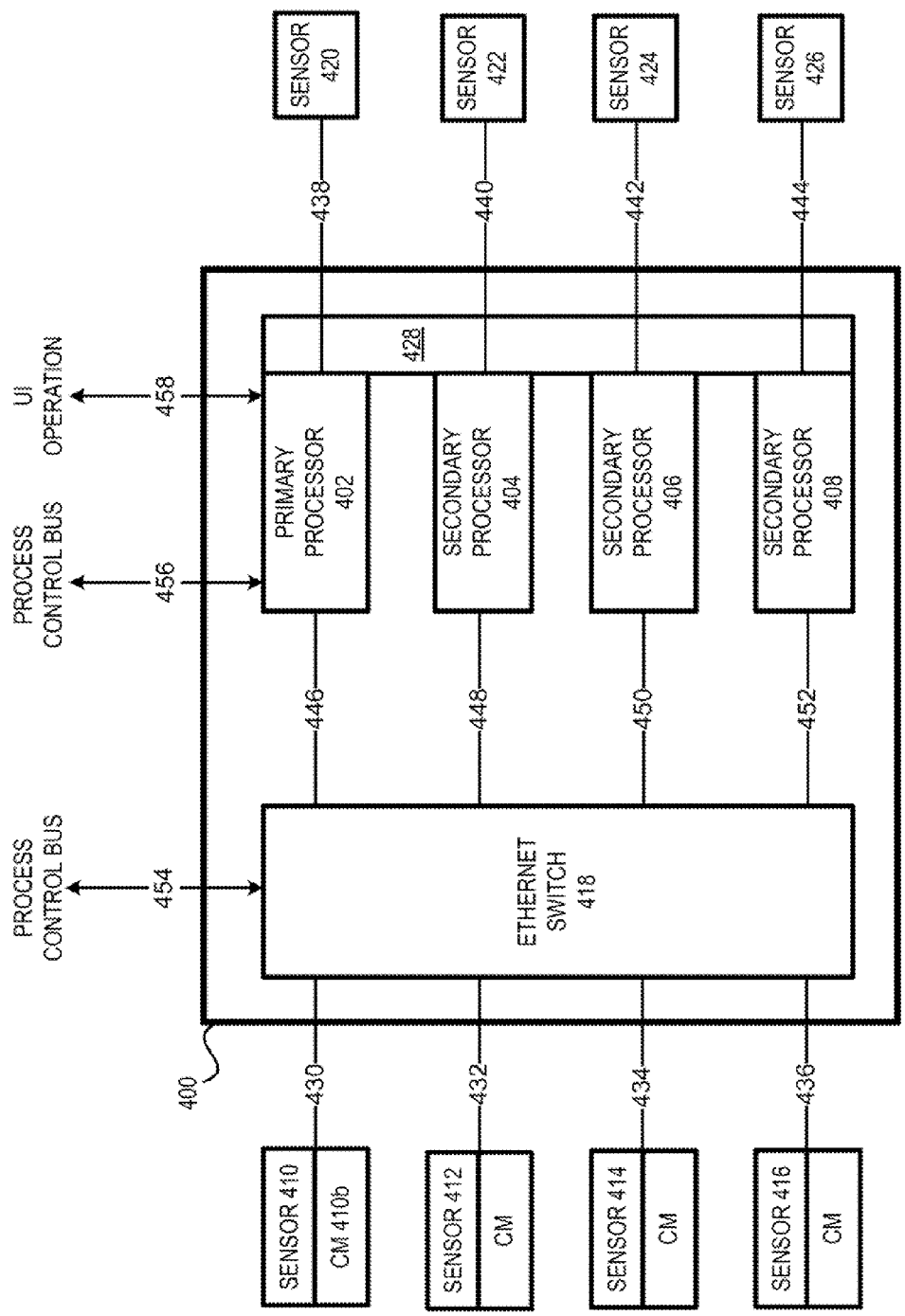
FIG. 4 shows, in an embodiment of the invention, a simple functional diagram of a process module level analysis server.

Further details about the process module level analysis server are provided in FIG. 4. FIG. 4 shows, in an embodiment of the invention, a simple functional diagram of a process-module-level analysis server. A process-module-level analysis server (such as APECS 400) may be assigned to each process module. APECS 400 is a bi-directional server and is configured for processing incoming data and for sending interdictions when uncontrolled events are identified.

Data sources may flow from two main sources, data collected by sensors and data collected by a process module. In an embodiment, APECS 400 is configured to receive incoming data from a plurality of sensors (sensors 410, 412, 414, 416, 420, 422, 424, and 426). Given that some cluster tool owners may have already invested a considerable amount of money into the traditional sensor arrangement (sensor with a computing module), APECS 400 is configured to accept data from both the traditional sensor arrangements and the modified sensors (sensor that does not require a computing module).

In an embodiment, APECS 400 may include an interface, such as Ethernet switch 418, for interacting with traditional sensor arrangements (such as sensors 410, 412, 414, and 416). In an example, data collected by sensor 410 is first converted from an analog format into a digital format by computing module 410b before the digital data is transmitted to APECS 400 (via paths 430, 432, 434, or 436). Ethernet switch 418 is configured to interact with the traditional sensor arrangements to accept the data streams. The data streams are then passed (via paths 446, 448, 450, or 452) to one of the processors (402, 404, 406, and 408) within APECS 400 for processing.

Instead of utilizing a traditional sensor arrangement for measuring process parameters, a modified sensor (one without a computing module) may be employed. Since the data collected does not have to be summarized, a computing module is no longer required for processing. Instead, a modified sensor may include a data converter (not shown), such as an inexpensive FPGA, for converting data from an analog format to a digital format, in an embodiment. Alternatively, instead of installing a data converter within the sensors, a data converter (not shown) may be installed within APECS 400. Regardless if the data converter is installed externally or internally to APECS 400, the elimination of the computing module provides a cost saving in the ownership of the cluster tool. In an example, the cost to purchase, house, and maintain the computing module is substantially eliminated.

In an embodiment of the invention, APECS 400 include a set of processors (402, 404, 406, and 408) for handling the incoming data. The set of processors may be physical processing units, virtual processors, or a combination thereof. Each processor is responsible for handling the data streams from the sources associated with the processor. In an example, data streams flowing in from sensor 422 via a path 440 are handled by processor 404. In another example, data streams collected by sensor 424 are transmitted to processor 406 via a path 442 for processing.

The number of processors and its relationship with the sensors may depend upon a user's configuration. In an example, even though FIG. 4 only shows a one-to-one relationship between the processors and the sensors, other relationships may exist. In an example, a processor may be configured to handle data from more than one source. In another example, more than one processor may be configured to handle data streams from one sensor.

Each of the processors shares a shared memory backbone 428, in an embodiment. As a result, load balancing may be performed when one or more processors are overloaded. In an example, if the data streams flowing in from sensor 426 via a path 444 is overwhelming processor 408 processing capability, other processors may be recruited to help reduce the load on processor 408.

Besides load balancing, a shared memory backbone also provides an environment for fault tolerance. In other words, if one of the processor is not working properly, the processing previously supported by the malfunctioning processor is redistributed to the other processors. In an example, if processor 406 is not functioning properly and is unable to process the data streams coming from sensor 424, processor 404 may be directed to handle the data streams from sensor 424. Accordingly, the ability to redistribute the workload enables the improperly functioning processor to be replaced without incurring downtime for the entire server.

In an embodiment, two types of processors may exist within APECS 400. The first type of processors is a secondary processor (such as processor 404, 406, or 408). Each secondary processor is configured to process the data streams received from its corresponding sensor(s). Additionally, each processor is configured to analyze the data and to identify any potential problem that may exist with the corresponding sensor(s), in an embodiment.

The second type of processor is known as a primary processor (402). Although FIG. 4 only shows one primary processor, the number of primary processors may depend upon user's configuration. In an embodiment, a primary processor may be configured to handle data streams from one or more sensors. In an example, data streams collected by sensor 420 are sent via a path 438 to primary processor 402 for processing.

Another source of data for a primary processor is a process module. In other words, the process module data and the process context data collected by a process module is processed by the primary processor. In an example, data collected by a process module is sent through a process control bus via a path 454 to APECS 400. The data first traverses through Ethernet switch 418 before flowing via path 446 to primary processor 402.

In addition to processing data, the primary processor is also configured to analyze data from multiple sources. In an example, data correlation between data streams from sensors 422 and 424 is performed by primary processor 402. In another example, data correlation between data streams from one or more sensors with data streams from a process module is also performed by primary processor 402.

Since the data paths for each of the data sources are now of about similar length, correlating the data is significantly less challenging than that experienced in the prior art. In an example, since the data flow from the process module to APECS 400 without having to go through other servers (such as a cluster tool controller and/or a fab host), the data streams from the process module does not experience changes due to computer and/or network conditions (such as computer drift, network latency, network loading and the likes) that may have occurred when the data streams have to be transmitted through other servers (such as a cluster tool controller, a fab host, and the likes) as described in FIG. 1 and FIG. 2. In addition, the wait time for receiving all of the relevant data streams require to perform correlation and analysis is now significantly reduced. Thus, correlating data from different sources is significantly simplified when external conditions (such as computer drift, network latency, network loading and the likes) have been substantially eliminated.

Besides the data path, quicker and more accurate analysis may be performed since a higher volume of data with more granularities from a single source provides more data points for performing correlation. In the prior art, correlation between data sources is usually difficult because the data that is available for analysis is usually incomplete since the prior art analysis server is unable to handle a high volume of data from a plethora of data sources. Unlike the prior art, the number of data sources is significantly reduced since each analysis server is now only responsible for analyzing data from a limited number of sources (the process module and the sensors associated with the process module). Since the number of data sources has been significantly reduced, the analysis server has the capacity to handle a higher volume of data from a single source. Given that more granular details are provided, better correlation may be achieved between the data streams of the various sources.

If a problem (such as an uncontrolled event) is identified, primary processor is configured to send an interdiction to the process module. In an embodiment, a direct digital output line 456 is employed to send an interdiction from APECS 400 to the process module. With a direct digital output line between the two devices, the interdiction does not have to be first converted into an Ethernet message before the interdiction can be transmitted. Accordingly, the time required to properly format the interdiction and then convert it back is substantially eliminated. Thus, APECS 400 is able to provide real-time interdictions or near-real time interdictions to the process module to handle the uncontrolled event.

In an embodiment, a primary processor may also be configured to interact with other devices via a path 458. In an example, if a cluster tool controller sends a request to APECS 400, the request may be sent via path 458 and be handled by primary processor 402. In another example, notification to the fab host may be sent via path 458 and the cluster tool controller.

As can be appreciated from one or more embodiments of the present invention, a process-level troubleshooting architecture is provided. By localizing the analysis server at the process module level, data granularity is provided for analysis resulting in a quicker and more accurate analysis. With a similar data path for the various data sources, better correlation exists between the various data streams. With quicker and more accurate analysis, troubleshooting may be performed on more timely basis with the interdiction provided in a timely manner to provide corrective action that may be employed to not only prevent the next substrate from being damaged but also to provide corrective action to fix the uncontrolled event impacting the affected substrate, thereby saving the affected substrate from being damaged. Thus, fewer numbers of substrates are wasted and damages to the processing chamber components may be substantially reduced.

In another aspect of the invention, the inventors herein realized that with a process-level troubleshooting architecture capable of performing timely, quick and accurate analysis, real-time in-situ detection of fast transient events (such as micro-arcing events, dechucking events, spiking events, etc.) may be identified and managed. As discussed herein, a fast transient event refers to an event (such as a micro-arcing event, dechucking event, spiking event, etc.) that may happen quickly and usually for a short duration during substrate processing. Due to the speed and the short length of time each event may last, the task of identifying a fast transient event has usually been performed offline, if at all possible, after an entire substrate lot has been processed.

In an example, one or more substrates may be inspected using an optical metrology tool, for example. Unfortunately, the inspection does not provide for real-time detection. Instead, by the time a micro-arcing event, for example, has been identified as occurring on the substrate, the substrate has not only been damaged but the rest of the substrate lot may have also been damaged. Additionally, damages to the hardware components within the processing chamber may have also occurred.

In recent years, fast transient sensors have been developed enabling fast transient electrical signatures (which is a result of fast transient events) to be captured. However, most fast transient sensors do not have the ability to classify the electrical signatures. In other words, the fast transient sensors may be capable of collecting the data; but, the fast transient sensors usually do not have the capability to classify the data into meaningful electrical signatures that may be employed to identify potential harmful events.

Consider the situation wherein, for example, during an etch process, electrical charge may build up causing micro-arcing to occur. As discussed herein, micro-arcing refers to an event that occurs when power is quickly dissipated and the dissipation causes damages to the pattern on the substrate (such as destruction of the layer, destruction to the pattern, melted layers, etc.). By employing a VI probe, data about micro-arcing may be collected. However, most fast transient sensors, such as VI probes, lack the intelligence to interpret the data and identify when a fast transient event, such as a micro-arcing event, has happened.

Instead, the data collected by the fast transient sensor may have to be analyzed by a third party, such as a human user or by a software program. In an example, a human user may have to analyze the plethora of data and make a determination (based on his expertise) if a fast transient event has occurred during substrate processing. The task of analyzing the data may take hours if not weeks. Even if the data analysis is performed by a software program, analyzing million of data samples may require time. By the time the problem is identified, damages to one or more substrate lots and/or to the hardware components of the processing chamber may have already occurred.

Detecting fast transient events, such as micro-arcing events, can be a difficult task since a micro-arcing event is usually not a predictable phenomenon. In other words, micro-arcing, for example, does not always occur on every substrate. In one aspect of the invention, the inventors herein realized that even though the timing of a micro-arcing event is unpredictable, the electrical signature of a micro-arcing event is not. In other words, each micro-arcing event may be represented by a unique signature.

Figure 5:
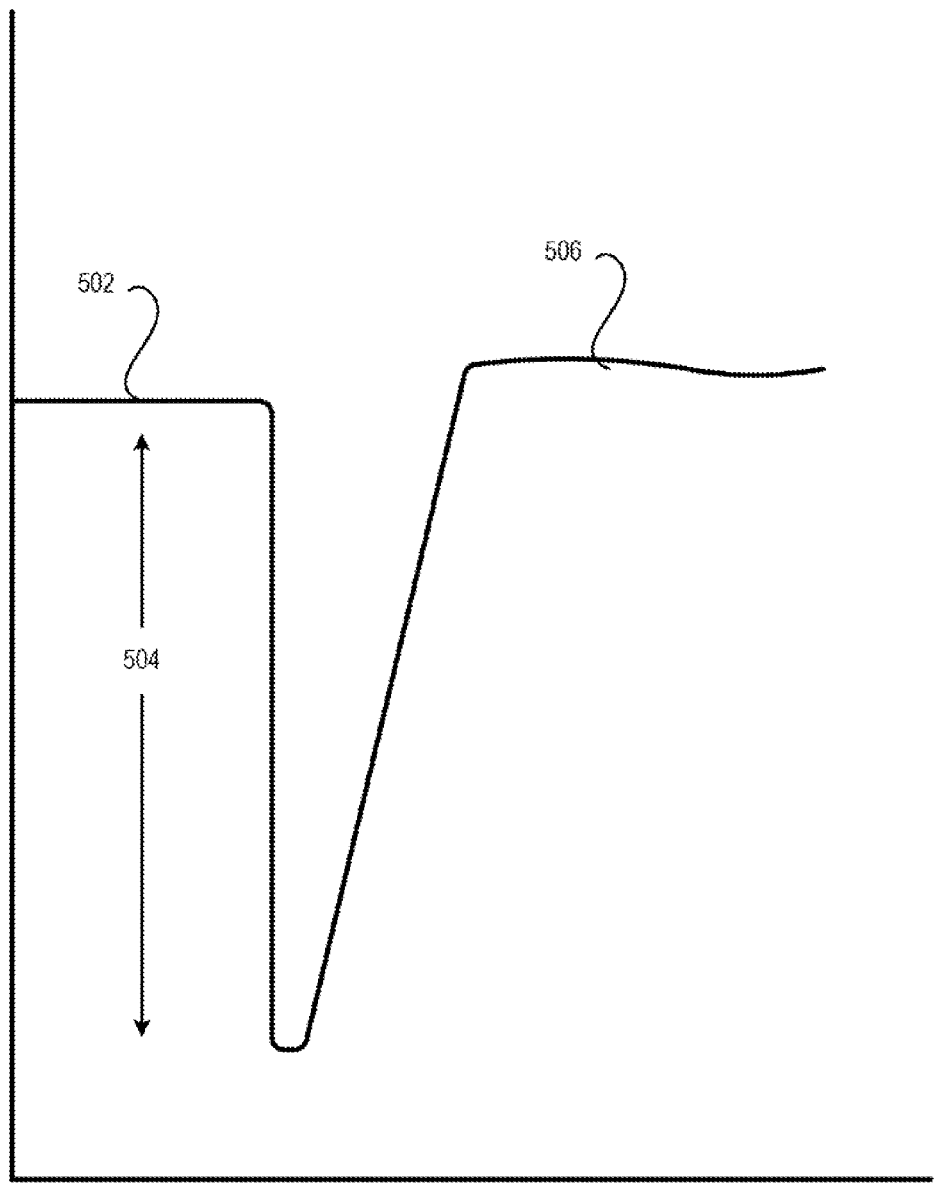
FIG. 5 shows, a simple diagram of a micro-arcing event.

FIG. 5 shows, a simple diagram of a micro-arcing event (curve 502). As can be seen from curve 502, when an on-wafer micro-arcing event occurs, the voltage and current signals experience a steep drop (504) simultaneously. Then the voltage and current signals undergo a reverse decay as the voltage and current signals gradually rise to a plateau (506) that may be at a different level than the point at which both signals dropped.

In accordance with embodiments of the invention, methods and arrangements are provided for handling a fast transient event, such as a micro-arcing event, within a processing chamber of a plasma processing system. Embodiments of the invention include methods for detecting a fast transient event (e.g., micro-arcing). Embodiments of the invention also include methods for classifying a fast transient electrical signature by performing a signature comparison with known fast transient signatures (such as arc signatures). Embodiments of the invention further include methods for classifying the severity of the fast transient event. Embodiments of the invention yet also include methods for managing the fast transient event to minimize damages during real-time production environment.

In this document, various implementations may be discussed using micro-arcing as an example. This invention, however, is not limited to micro-arcing and may include any fast transient event that may occur during substrate processing. Instead, the discussions are meant as examples and the invention is not limited by the examples presented.

In an embodiment of the invention, methods and arrangements are provided for detecting a potential micro-arcing event. As aforementioned, fast-transient sensors (such as VI probes) that are capable of performing a high sampling rate (e.g., collecting millions or billions of data points in a second) may be employed to collect data during substrate processing. In an embodiment, a fast sampling transient detection algorithm may be running while the VI probe, for example, collects data during substrate processing. In an embodiment, the fast sampling transient detection algorithm may include criteria for defining a potential fast transient electrical signal. In an example, to identify a potential on-wafer micro-arcing event, the fast sampling transient detection algorithm may be searching for an event in which both the voltage and the current signals simultaneously drop. In another example, to identify a potential chamber micro-arcing event, the fast sampling transient detection algorithm may be employed to search for an event in which both the voltage and the current signals are both spiking.

In an embodiment, the fast sampling transient algorithm is performed by a sensor controller (such as a VI probe controller), a computing module that is coupled to the sensor (e.g., VI probe) and is configured to provide an interface to the sensor (e.g., VI probe) and to receive data from the sensor (e.g., VI probe). In another embodiment, the fast sampling transient algorithm is performed by a computing module that is interacting with the sensor controller (e.g., VI probe controller). In yet another embodiment, the fast sampling transient algorithm is performed by an analyzing module that is interacting directly with the sensor (e.g., VI probe).

If a potential micro-arcing event is identified by either the sensor (e.g., VI probe) or a computing module that is interacting with the sensor (e.g., VI probe), then in an embodiment, the waveform of the voltage and current signals (e.g., electrical signatures) that occur at around the occurrence of the event may be saved and forwarded to an analyzing module, such as a process-module-level analysis server (e.g., APECS 314), for analysis. In other words, by performing the detection at the sensor level, only data about potential fast transient electrical signatures (such as micro-arcing) are forwarded onward to an analyzing module for further analysis. Thus, instead of sending all the data to the analyzing module for analysis, filtering may be performed to reduce the amount of data traffic being sent along a data path, thereby reducing bandwidth requirement and reducing the processor capability of the analyzing module.

However, if a potential micro-arcing event is identified by an analyzing module that is interacting directly with the sensor (e.g., VI probe), then in an embodiment, data filtering is not required. Instead, the analyzing module (such as APECS 314), which is part of the process-level troubleshooting architecture may have a fast processor that is capable of handling a large volume of data. Given the unique inventive process-level troubleshooting architecture, common data traffic congestion that may occur in other type of analysis architecture may be substantially eliminated. As a result, the analyzing module is capable of analyzing millions of data samples quickly and efficiently.

In an embodiment of the invention, classification of a potential fast transient electrical signature may be performed. In an example, once the waveform of the potential fast transient event is received by the analyzing module, the analyzing module may compare the potential fast transient electrical signature against a set of fast transient signatures (such as a set of arc signatures). In an embodiment, different known waveforms that may be examples of a fast transient event, such as micro-arcing, may be stored within a library.

If the potential fast transient electrical signature matches one of the set of fast transient signatures saved in the library, the severity of the fast transient event may then be determined, in an embodiment. In an example, the fast transient event may be an event that may have little or no impact on the substrate being processed. Thus, the event may be classified as an event with a low severity level. In another example, the fast transient event may be an event that may have damaged the current substrate being processed. Thus, the fast transient event may be classified with a high severity level.

By identifying the severity of the fast transient event, a determination can be made on how best to handle the fast transient event. In an embodiment of the invention, predefined course of actions may be provided depending upon the severity of the fast transient event. In an example, a fast transient event with a low severity level may trigger a warning while a fast transient event with a high severity level may result in the etch process, for example, being terminated.

Figure 6A:
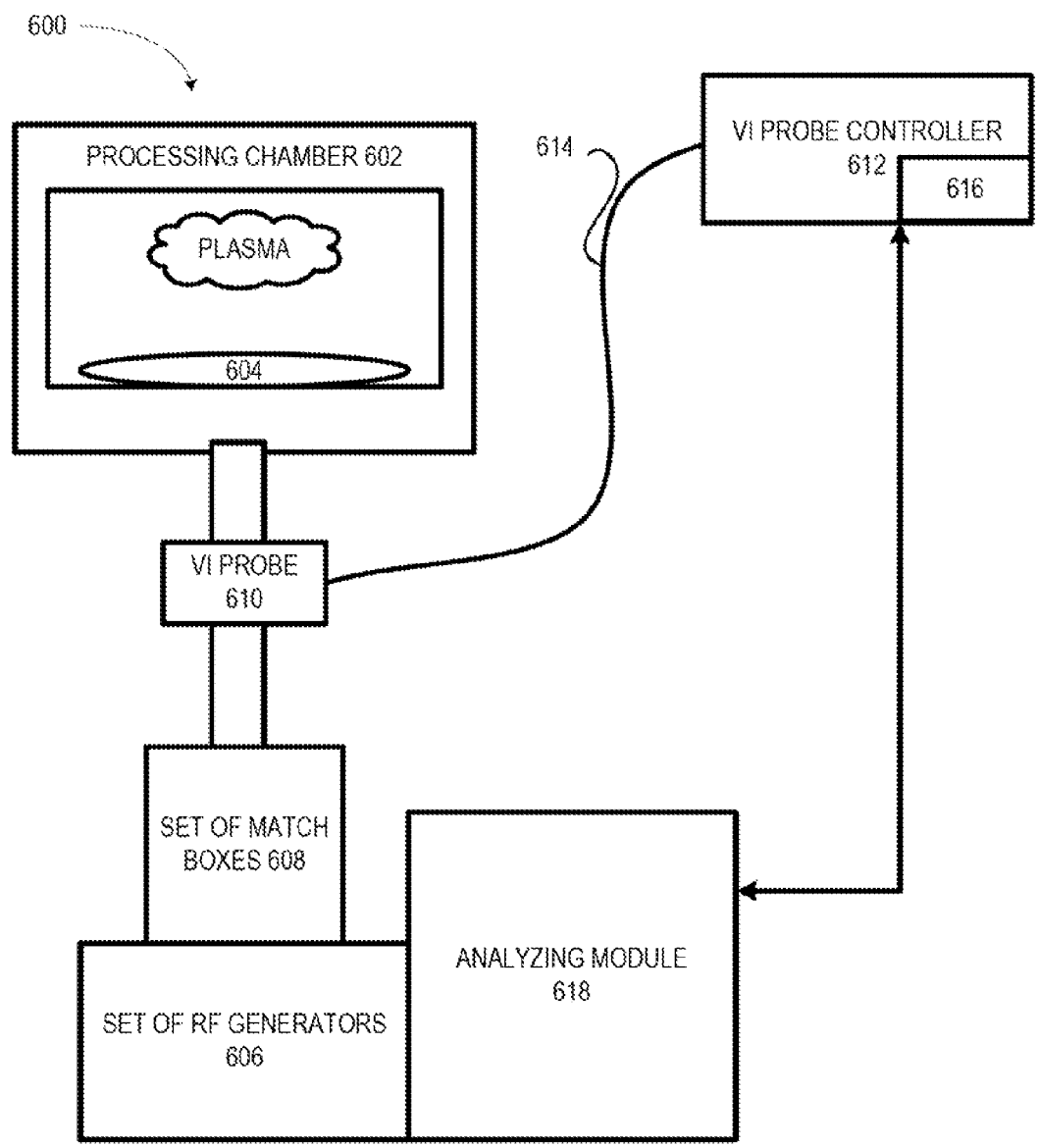
FIGS. 6A and 6B show, in embodiments of the invention, simple block diagrams of a processing environment.

To facilitate discussion, FIG. 6A shows, in an embodiment of the invention, a simple block diagram of a processing environment. A processing system 600 may include a processing chamber 602 in which a substrate 604 is being processed. During substrate processing, gas (not shown) may interact with power (provided through a set of RF generators 606 via a set of match boxes 608) to create plasma for etching the substrate.

During substrate processing, if an electrical charge build up occurs causing a fast transient event to occur, the data may be collected by a VI probe 610 and identified by a fast sampling transient detection algorithm module 616. Fast sampling transient detection algorithm module 616 may include criteria for defining a fast transient event, in an embodiment.

In an embodiment, the fast sampling transient detection algorithm module may be configured to run during substrate processing.

In an embodiment, the data collected may be forwarded to a VI probe controller 612 along a set of paths 614. VI probe controller 612 is configured at least for managing VI probe 610. In an embodiment, VI probe controller 612 may also include fast sampling transient detection algorithm module 616.

In another embodiment, fast sampling transient detection algorithm module 616 may be an independent computing module that may communicate with VI probe controller 612. In other words, the data collected by VI probe 610 may be sent via VI probe controller 612 to fast sampling transient detection algorithm module 616. By making fast sampling transient detection algorithm module 616 an independent module, VI probe controller 612 does not have to be modified if VI probe controller 612 is not capable of handling additional processing.

Figure 6B:
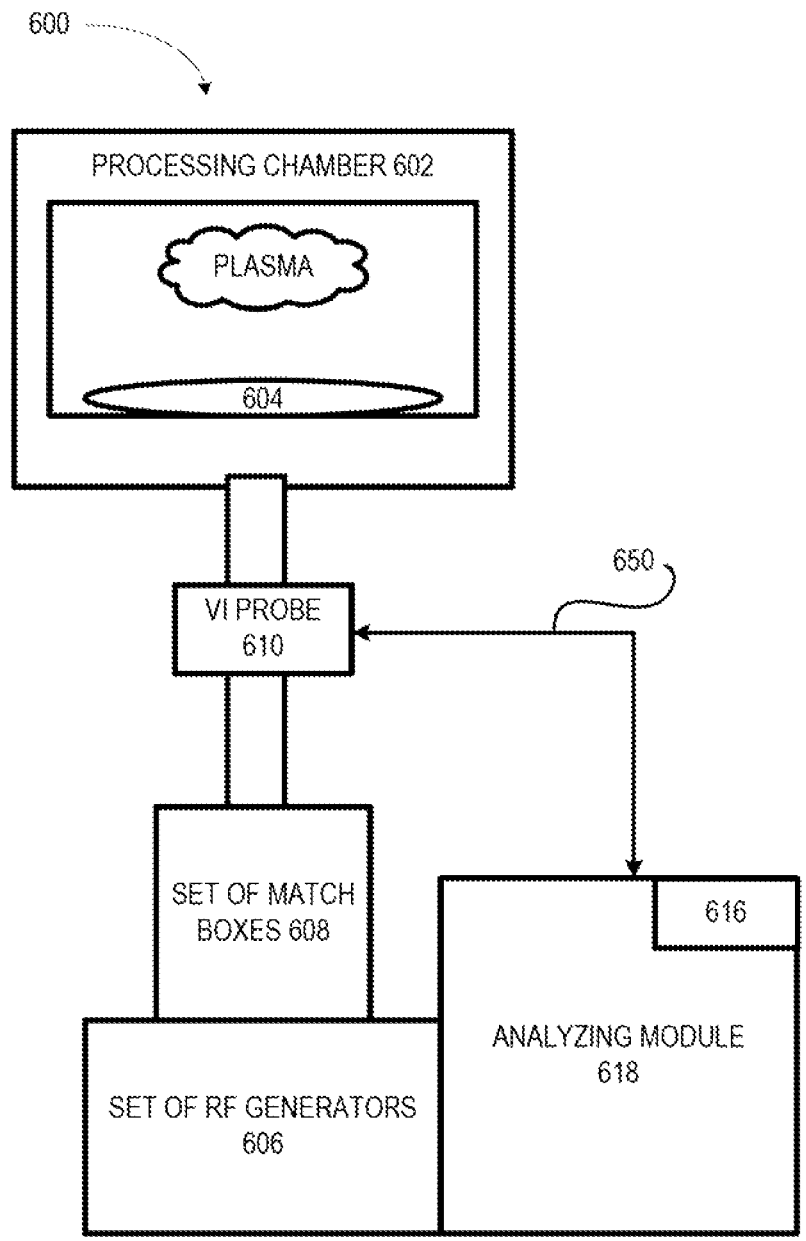

In another embodiment, instead of sending the data to VI probe controller 612, the data may be sent directly from VI probe 610 via a path 650 to an analyzing module 618 (as shown in FIG. 6B), which may house fast sampling transient detection algorithm module 616. By transmitting the data directly to analyzing module 618, data collected by the VI probe 610 do not have to be preprocessed. In addition, a computing module (such as VI probe controller 612) may be eliminated to reduce real estate overhead. Instead, analyzing module 618 may be employed to identify a potential fast transient electrical signature.

Once a potential fast transient electrical signature has been detected based on the predefined criteria, the potential fast transient electrical signature may be classified by analyzing module 618, such as a process-module-level analysis server (e.g., APECS 314). In an embodiment, analyzing module 618 may perform signature comparison by comparing the potential fast transient electrical signature against a set of fast transient signatures stored within a library, such as a set of arc signatures. If a match is identified, a fast transient event is considered to have occurred.

In an embodiment, analyzing module 618 is configured to determine the severity of the fast transient event. Those skilled in the art are aware that fast transient events may have different severity (e.g., intensity) levels. Accordingly, an algorithm is provided determining the severity of each fast transient event. In an embodiment, the severity level/threshold range may be predefined and may be user-configurable. As an example, a drop greater than 4 dB in the current or voltage signal and a duration (defined as from the drop to the recovery) longer than 15 microseconds may be deemed as appropriate thresholds for detection of damage on the wafer.

Once the severity level for a fast transient event has been classified, a course of action may be applied. In an embodiment, the course of actions may be predetermined and may be associated with the severity level/threshold range. In an embodiment, the course of action may be user-configurable. In an example, a fast transient electrical signature (such as micro-arcing) with a small voltage and current drop may be considered as harmless and may require only a notification to be sent to the operator. In another example, a fast transient electrical signature with a large voltage and current drop may be considered as an event with a high severity level and a termination of the substrate process may be triggered.

Figure 7:
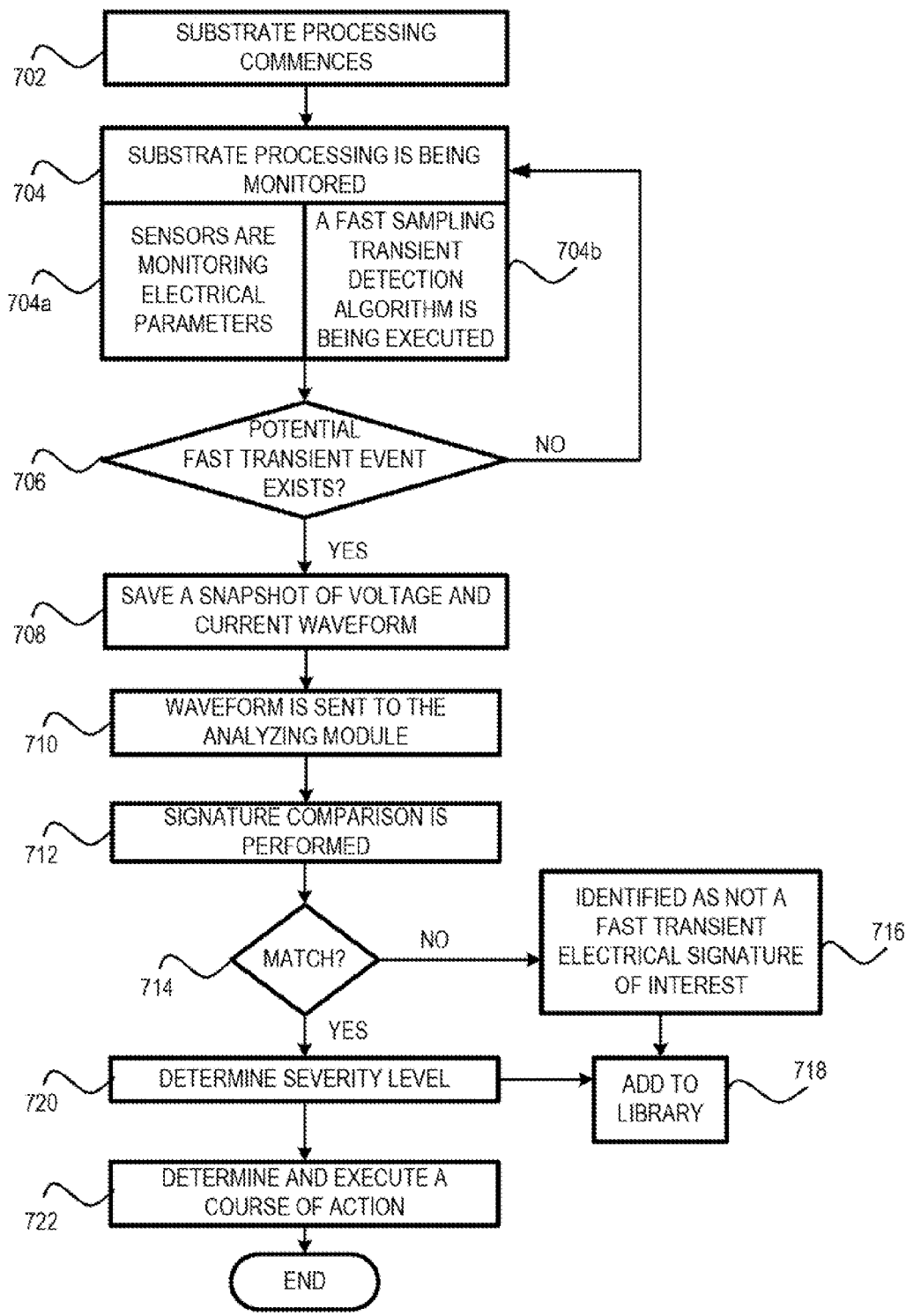
FIG. 7 shows, in an embodiment of the invention, a simple flowchart illustrating a method for detecting a real-time fast transient event within a production environment in which the fast sampling transient detection algorithm is not part of an analyzing module.

FIG. 7 shows, in an embodiment of the invention, a simple flow chart illustrating a method for detecting a real-time fast transient event within a production environment in which the fast sampling transient detection algorithm is not part of an analyzing module.

At a first step 702, substrate processing commences. Consider the situation wherein, for example, substrate 604 is being processed within processing chamber 602.

At a next step 704, substrate processing within the processing chamber is being monitored. At a step 704a, fast transient sensors, such as VI probes, may be monitoring electrical parameters (e.g., voltage and current signals at different phases, fundamentals and harmonics). At about the same time, at a step 704b, a fast sampling transient detection algorithm may be executed.

At a next step 706, a determination is made about the existence of a potential fast transient event. In other words, the fast sampling transient detection algorithm may include criteria for defining a potential fast transient event, such as micro-arcing, for example. If the data collected by the VI probe does not meet the criteria defined by the fast sampling transient detection algorithm, then no potential fast transient event has occurred and the VI probe continues monitoring the substrate process (step 704).

However, if a potential fast transient event is identified, then at a next step 708, the voltage and current waveform at around the occurrence of the potential fast transient event may be saved.

At a next step 710, the saved waveform is transmitted to an analyzing module. In an embodiment, only the data related to the occurrence of the potential fast transient event may be saved and transmitted. By only sending the potential fast transient electrical signature, resource drain may be minimized. In addition, since preprocessing has been performed by the sensor controller (such as the VI probe controller), the analyzing module may not need to include a fast processor to analyze the data and quickly classify and determine a course of action for the potential fast transient event.

At a next step 712, signature comparison is performed by the analyzing module. In an embodiment, the analyzing module may compare the potential fast transient electrical signature against a set of fast transient signatures. In an embodiment, the set of fast transient signatures may be stored within a library. In an embodiment, the library may also include non-fast transient signatures to enable correlation to be performed.

At a next step 714, a determination is made on the classification of the potential fast transient electrical signature. If the signature comparison results in no match being identified, then the potential fast transient electrical signature is not classified as a fast transient electrical signature of interest (step 716). In an embodiment, the potential fast transient electrical signature may be discarded. In another embodiment, the potential fast transient electrical signature may be added to the library as a new fast transient electrical signature (step 718).

However, if the signature comparison results in a fast transient electrical signature being identified, then at a next step 720, the severity of the fast transient event is determined. In an example, the severity may range from low to high. In an embodiment, the severity may be based on a predefined set of threshold ranges. In an embodiment, the fast transient electrical signature may be added to the library (step 718). Step 718 is an optional step and is not required in detecting real-time fast transient events.

At a next step 722, a course of action is determined. Once the severity level has been determined, a course of action may be executed. In an embodiment, the course of action may be predefined. In an example, a fast transient electrical signature with a low severity level may trigger a notification to the operator. In another example, a fast transient electrical signature with a medium severity level may trigger an alarm. In yet another example, a fast transient electrical signature with a high severity level may trigger a termination of the substrate process. As can be appreciated from the foregoing, the severity levels and the course of actions associated with the severity levels may be user-configurable.

FIG. 7 shows, but one embodiment for implementing a method for detecting a real-time fast transient event within a production environment. In another example, the method may also be applied to detect a real-time fast transient event in which the fast sampling transient detection algorithm is part of an analyzing module, in an embodiment. In this type of environment, the execution of the fast sampling transient detection algorithm may be performed by an analyzing module (such as APECS 314) instead of a VI probe controller. In an embodiment, the analyzing module is a fast processing computing module that is capable of handling a high volume of data. In an embodiment, the analyzing module is directly coupled with the sensor. Thus, data is collected by the sensor and transmitted directly to the analyzing module.

As can be appreciated from the foregoing, arrangements and methods are provided for detecting an in-situ real-time fast transient event. In the prior art, detection of a fast transient event is usually performed after substrate processing has been completed for a substrate lot. Further, complex metrology tools may be required to determine the existence of a fast transient event. Since the existence of a fast transient event is unpredictable, each substrate within a substrate lot may have to be measured in order to determine the potential damage that may have occurred.

In contrast to the prior art, embodiments of the invention provide for the detection of fast transient events during substrate processing in real-time, thereby minimizing damages to the rest of the substrate lot and/or the processing chamber. In addition, unlike the prior art, the detection process is an automated process that require little or no human interference. Instead, once the user-configurable conditions/criteria/thresholds have been defined, the system is configured to detect a fast transient event automatically.

Given that fast transient events (such as micro-arcing events) may be identified in real-time within a production environment, the latency between the actual occurrence and the course of action taken to manage the occurrence may be reduced. In the prior art, the latency may take hours or even weeks. However, with the methods and/or arrangements described herein, the latency may be reduced to mere milliseconds, thereby reducing the overall cost of ownership.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for detecting an in-situ fast transient event within a processing chamber of a plasma processing system during substrate processing, said method comprising:

receiving data indicative of electrical conditions within the processing chamber using a fast-transient sensor operating at a high sampling rate, wherein the fast-transient sensor comprises a sensor controller implementing a fast sampling transient algorithm contemporaneously with the receipt of the data, wherein the fast sampling transient algorithm identifies potential in-situ fast transient events in the received data based on the application of pre-defined criteria, wherein the pre-defined criteria includes a simultaneous voltage and current spike in the received data;

when a potential in-situ fast transient event in the received data is identified by the sensor controller, extracting from the received data an electrical signature corresponding to the potential in-situ fast transient event, wherein the extraction is implemented by the fast sampling transient algorithm and performed in a time period during which the potential in-situ fast transient event occurs;

receiving, by an analyzing module separate from the fast-transient sensor, the electrical signature directly from the fast-transient sensor, wherein the analyzing module is a process-module-level analysis server to perform analysis for a process module and a set of fast-transient sensors associated with the process module;

analyzing the received electrical signature by the analyzing module, wherein analyzing includes comparing the received electrical signature against a set of stored arc signatures;

classifying, by the analyzing module, the received electrical signature as a first in-situ fast transient event when the received electrical signature matches one of the set of stored arc signatures;

adding, by the analyzing module, the received electrical signature to a library as a non-fast transient event when the received electrical signature does not match one of the set of stored arc signatures; and determining, by the analyzing module, a severity level for the first in-situ fast transient event based on a predefined set of threshold ranges.

2. The method of claim further including determining a course of action based on said severity level of said first in-situ fast transient event.

3. The method of claim 1 wherein said first in-situ fast transient event is a micro-arcing event.

4. An arrangement for detecting an in-situ fast transient event within a processing chamber of a plasma processing system, wherein said processing chamber includes a plurality of sensors configured for collecting data during substrate processing, said arrangement comprising:

a fast-transient sensor operating at a high sampling rate configured to receive data indicative of electrical conditions within the processing chamber, wherein the fast-transient sensor comprises a sensor controller implementing a fast sampling transient algorithm contemporaneously with the receipt of the data, wherein the fast sampling transient algorithm identifies potential in-situ fast transient events in the received data based on the application of pre-defined criteria, wherein the pre-defined criteria includes a simultaneous voltage and current spike in the received data;

wherein the sensor controller is configured such that when a potential in-situ fast transient event in the received data is identified by the sensor controller, the fast sampling transient algorithm extracts from the received data an electrical signature corresponding to the potential in-situ fast transient event, wherein the extraction is performed in a time period during which the potential in-situ fast transient event occurs;

an analyzing module separate from the fast-transient sensor configured to receive the electrical signature directly from the fast-transient sensor, wherein the analyzing module is a process-module-level analysis server configured to perform analysis for a process module and a set of fast-transient sensors associated with the process module;

wherein the analyzing module is further configured to:
analyze the received electrical signature by comparing the received electrical signature against a set of stored arc signatures;
classify the received electrical signature as a first in-situ fast transient event when the received electrical signature matches one of the set of stored arc signatures;
add the received electrical signature to a library as a non-fast transient event when the received electrical signature does not match one of the set of stored arc signatures; and
determine a severity level for the first in-situ fast transient event based on a predefined set of threshold ranges.

5. The arrangement of claim 4 further including a library, wherein said library is configured for storing said set of stored arc signatures.

6. The arrangement of claim 5 wherein said library is configured for storing non-fast transient signatures.

7. The arrangement of claim 4 wherein analyzing module is configured for sending said course of action directly to a process module controller when said fast transient event is identified during said substrate processing.

8. The arrangement of claim 4 wherein said analyzing module is further configured for determining a course of action based on said severity level of said fast transient event.

9. The arrangement of claim 4 wherein said fast transient event is a micro-arcing event.

10. The arrangement of claim 4 wherein said fast sampling transient algorithm module is controlled by said analyzing module that is configured to interact directly with said plurality of sensors.

* * * * *